(12) United States Patent
Chen

(10) Patent No.: US 7,795,638 B2
(45) Date of Patent: Sep. 14, 2010

(54) SEMICONDUCTOR DEVICE WITH A U-SHAPE DRIFT REGION

(75) Inventor: Xingbi Chen, Chengdu (CN)

(73) Assignee: University of Electronic Science and Technology, Chengdu, Sichuan (CN)

( * ) Notice: Subject to any disclaimer, the term of this patent is extended or adjusted under 35 U.S.C. 154(b) by 0 days.

(21) Appl. No.: 12/197,778

(22) Filed: Aug. 25, 2008

(65) Prior Publication Data

US 2009/0057711 A1  Mar. 5, 2009

(30) Foreign Application Priority Data

Aug. 28, 2007  (CN) .................. 2007 1 0145552

(51) Int. Cl.
*H01L 29/80* (2006.01)
(52) U.S. Cl. ............... 257/141; 257/140; 257/E29.027; 257/E29.029; 257/E29.066; 257/E29.197; 257/E21.382
(58) Field of Classification Search ......... 257/139–141, 257/E29.027, E29.029, E29.066, E29.197, 257/E21.382
See application file for complete search history.

(56) References Cited

U.S. PATENT DOCUMENTS

| | | | |
|---|---|---|---|
| 4,963,951 A * | 10/1990 | Adler et al. .................. 257/141 |
| 5,434,435 A | 7/1995 | Baliga | |
| 5,844,275 A * | 12/1998 | Kitamura et al. ............ 257/335 |
| 5,877,518 A * | 3/1999 | Sakurai et al. .............. 257/139 |
| 6,462,377 B2 * | 10/2002 | Hurkx et al. ................. 257/339 |
| 6,525,397 B1 | 2/2003 | Kalnitsky et al. | |
| 6,998,680 B2 | 2/2006 | Kitamura et al. | |

* cited by examiner

*Primary Examiner*—N Drew Richards
*Assistant Examiner*—Yu-Hsi Sun
(74) *Attorney, Agent, or Firm*—Townsend and Townsend and Crew LLP.; M. Henry Heines

(57) ABSTRACT

A cell of a semiconductor device comprises a substrate of n-type with a trench formed in a portion of a first main surface of the substrate and filled with insulator. Two device-feature regions are formed beneath the first main surface of the substrate, the first one at one side and the second one at the other side of the trench. A region of a p-type and/or a region of metal is formed in the first device feature region and is connected to a first electrode. A p-n junction is formed in the second device feature region and the p-region of the p-n junction is connected to a second electrode. A U-shaped region is formed between the two device regions. An IGBT without tail during turning-off can be fabricated with a simple process at a low cost.

1 Claim, 14 Drawing Sheets

SEMICONDUCTOR DEVICE WITH A U-SHAPE DRIFT REGION

CROSS-REFERENCES TO RELATED APPLICATIONS

This application claims priority to Chinese Patent Application No. 200710145552.1, filed Aug. 28, 2007, the contents of which are hereby incorporated by reference in its entirety.

FIELD OF THE INVENTION

This invention is related to semiconductor devices, and particularly related to high-voltage devices and/or power devices, which can be discrete ones and can also be implemented in power integrated circuits.

BACKGROUND OF THE INVENTION

In a conventional vertical high-voltage device, a low-resistivity substrate is normally used to reduce the on-resistance. On the low-resistivity substrate, a high resistivity layer is grown as the drift region (also called as the voltage sustaining layer) by epitaxy or direct wafer bonding. In some vertical devices, there are more epi-layers that need to grow. For instance, in a non-punch-through IGBT, an $n^+$-type (or a $p^+$-type) thin epi-layer is first grown on a $p^+$ (or $n^+$)-substrate, and then a thick n-type epi-layer is grown on the thin epi-layer.

FIG. 1 shows a cross-sectional view of the device structure presented in Kitamura et al., U.S. Pat. No. 5,844,275 (1998). A p-well is formed in a portion of the surface of a p-type substrate. A trench is formed in the p-well and filled with an insulator material such as $SiO_2$. An n-type drift region is formed surrounding the trench from the side of the sidewalls to the bottom wall thereof. A p-type source-body region and an n-type source region are formed in a portion of the surface of the p-well at one side of the trench. An electrode is then formed so as to be in contact to the n-type source region and p-type source-body region. An n-type drain region is formed at the other side of the trench by diffusion or ion implantation. An electrode is deposited so as to be in contact to the drain region. A poly-silicon gate is deposited on the gate oxide grown on the substrate from the trench to the n-type source region. A conductive channel is formed by applying a positive bias larger than the threshold voltage on the gate to turn the device on.

FIG. 2 shows the device structure in Kalnitsky et al., U.S. Pat. No. 6,525,397 B1 (2003). It is a high-voltage MOS for programming an integrated fuse element. N-wells are formed in parts of the surface of a p-type substrate. Trenches are formed in parts of the surface of the n-wells. U-shape voltage sustaining regions are defined based on trench isolation. A source region is formed by an $n^+$ doping at one side of the trench in a portion of the surface of the p-substrate. A drain region is formed by an n+ doping at the other side of the trench in a portion of the surface of the n-well. A p-n junction isolation between the high-voltage device and other devices is realized through the n-well and the p-substrate formed.

FIG. 3 shows a cross-sectional view of the device structure utilizing a trench presented in Kitamura et al., U.S. Pat. No. 6,998,680 B2 (2006). It is similar to the device shown in FIG. 1. When a voltage higher than the threshold voltage is applied to the gate, the device is turned on and a current flows from the drain electrode, through the drain region, the U-shape drift region, the channel and the source region, and eventually to the source electrode.

FIG. 4 shows a cross-sectional view of a lateral MOS structure based on a trench in Baliga, B. J., U.S. Pat. No. 5,434,435 (1995). The polycrystalline silicon gate is formed in a portion of one edge inside the trench. The conductive channel is formed along the sidewall of the trench in the on-state. An intermediate layer is used for isolation between the drift region and the substrate. Two methods of isolation can be applied in this structure. For dielectric isolation, an oxide can be used as the intermediate layer grown on an n-type or a p-type substrate. For junction isolation, a p-type Si can be used as the intermediate layer.

It is noticed the drift region in above devices is doped oppositely to the doping type of the substrate, leading to a more complex process. Furthermore, the device feature region, including the source region, the source-body region and part of the gate region is formed outside of the U-shape drift region, causing a large area.

Although trench etching is a mature process in modern technology of micro-electronics, the method of forming the gate in Baliga, B. J., U.S. Pat. No. 5,434,435 (1995) still makes the process more complex. In addition, another direct wafer bonding or epitaxy should be conducted for growing the intermediate layer for isolation, leading to a higher cost.

Generally speaking, many devices are composed of two device feature regions, and a drift region is between the two feature regions. Under a reverse bias, the drift region becomes a voltage-sustaining region. In a conventional vertical device, one device feature region is formed in the surface of the substrate and the other is formed in the bottom of the substrate. For example, in a high-voltage n-MOS, the drift region is a lightly doped n-type region and its drain region is a heavily doped $n^+$-region. The drain region can be considered as one of the device feature regions. For a non-punch-through IGBT with an n-MOS included, one of its device feature regions is the n-MOS formed in the surface of the substrate and the other device feature region is the thin $n^+$-layer on the $p^+$-substrate. The thick $n^-$-epi-layer between the two device feature regions is the drift region. Obviously, the implementation of the latter device feature region causes a more complex process and a higher fabrication cost.

Besides, in order to reduce the injection of the minorities to the drift region and thus to realize a shorter turn-off time, normally, the injection efficiency should be taken into account in design the material parameters. There is a trade-off between the on-voltage and the turn-off time. Even such a trade-off is optimized, it is still not able to eliminate the injection of the minorities during the turn-off process entirely.

SUMMARY OF THE INVENTION

In the present invention, a semiconductor device with a U-shape drift region is provided, which can be implemented with a simple process at a lower cost.

In order to solve the problem stated above, according to an embodiment of the present invention, a method of forming a semiconductor device with a U-shape drift region is provided. The method comprises: (a) providing a substrate which is a first conductivity type or a combination of a region of a first conductivity type and a region of a second conductivity type; (b) forming at least one trench filled with an insulator material in a portion of a first main surface of the substrate; (c) forming a cell of the device, the cell includes the trench and the portion surrounding the trench; (d) forming two device feature regions with the first in a portion of the first main surface of one side of the trench and the second in a portion of the first main surface of the other side of the trench; (e) forming at least one region of a second conductivity type or one region of metal connected to a first electrode in the first device feature region; (f) forming at least one region of a first conductivity type or one region of metal connected to a second electrode in the second device feature region in a portion. When the substrate is a combination of a region of a first conductivity type and a region of a second conductivity type, the second conductivity type region surrounds the trench and is surrounded by the region of the first conductivity type. A U-shape drift region between the first device feature region and the second device feature region in the substrate along the trench is then formed.

According to still another embodiment of the present invention of the semiconductor device with a U-shape region, the surface of the substrate opposite to the first main surface, called as a second main surface, may have an ohmic contact or a thin heavily doped layer of a first conductivity type, and thus can be connected to the second electrode through an outer connection.

According to still further another embodiment of the present invention, a method of forming a Schottky diode with a U-shape drift region is provided. The method comprises: (a) forming at least one metal-semiconductor contact by the semiconductor substrate and a metal region in a portion of the first main surface in the first device feature region, wherein the metal region is connected to the first electrode; (b) forming at least one region of a first conductivity type in a portion of the first main surface in the second device feature region connected to the second electrode.

According to still further another embodiment of the present invention, a method of forming an IGFET with a U-shape drift region is provided. The method comprises follows. (a) Forming at least one IGFET with a heavily doped source region of the first conductivity type in a portion of the first device feature region. (b) Forming a source-body region of a second conductivity type surrounding the source region except at the first main surface. (c) Forming a source electrode as the first electrode, through which the source region is connected to the source-body region. (d) Forming a drain region of the IGFET in a portion of the first main surface of the second device feature region with the drain electrode as the second electrode. (e) Forming an insulator layer on part of the first main surface of the first device feature region. (f) Forming a gate electrode on part of the surface of the insulator layer, which covers a part of the source region of the IGFET, a part of the source-body region and a part of the region of a first conductivity type in contact with the substrate.

According to still further another embodiment of the present invention, a method of forming an IGBT with a U-shape drift region is provided. The method comprises follows. (a) Forming an IGFET, wherein a heavily doped source region of a first conductivity type is surrounded by a source-body region of a second conductivity type in the first device feature region, except at the first main surface. And, a part of the source region and a part of the source-body region are connected to the first electrode, which is the source electrode of the IGFET of a first conductivity type and also serves as the collector of the IGBT; an insulator layer is formed on part of the first main surface of the first side. A gate electrode is formed on the top of the insulator layer, and the gate electrode covers a part of the source region of the IGFET of a first conductivity type, a part of the source-body region and a part of the region of a first conductivity type contacted with the substrate. The drain region of the IGFET of a first conductivity type is formed in the second device feature region and contacted to the second electrode, which is the drain electrode of the IGFET. (b) Forming an emitter region, which is a heavily doped region of a second conductivity type formed in the second device feature region and is connected to a metal electrode, which is the emitter electrode.

According to still further another embodiment of the present invention, a method of forming a SINFET with a U-shape drift region is provided. The method comprises follows. (a) Forming at least one IGFET, wherein a heavily doped source region of a first conductivity type is surrounded by a source-body region of a second conductivity type in the first device feature region except at the first main surface. And, a part of the source region and a part of the source-body region are connected to the first electrode, which is the source electrode of the IGFET of a first conductivity type and also serves as the collector of the SINFET; an insulator layer is formed on part of the first main surface of the first side. A gate electrode is formed on the top of the insulator layer, and the gate electrode covers a part of the source region of the IGFET of a first conductivity type, a part of the source-body region and a part of the region of a first conductivity type contacted with the substrate. The drain region of the IGFET is a region of first conductivity type in the second device feature region. (b) Forming a metal-semiconductor Schottky contact by a metal region in the second device feature region, the metal-semiconductor contact having a capability of injection of minority carriers into the drift region.

According to still further another embodiment of the present invention, a method of forming an IGBT with a second gate assisting in the turn-off process is provided. The method comprises follows. (a) Forming at least one IGFET of a first conductivity type with a heavily doped source region of a first conductivity type in the first device feature region and being contacted to the first electrode. The drain region of the IGFET of a first conductivity type is formed in a portion of the second device feature region and being contacted to the second electrode. The source region is surrounded by the source-body region of a second conductivity type in the first device feature region except at the first main surface and is connected to the first electrode, which is also the source electrode of the IGFET of a first conductivity type. A first insulator layer is foamed on a part of the first main surface of the first side; and a gate electrode is formed on a part of the top of the first insulator layer. The gate electrode covers a part of the source region of said IGFET of a first conductivity type, a part of said source-body region and a part of the region of a first conductivity type in contact with the semiconductor substrate. (b) Forming at least one IGFET of a second conductivity type with a heavily doped source region of a second conductivity type in the second device feature region. The drain region of the IGFET of a second conductivity type is formed in a heavily doped region of a second conductivity type in a portion of the first main surface in the second device feature region. At one side of the drain region, there is a heavily doped region of a first conductivity type, which is connected to the drain region through a surface electrode and thus is connected to the region of a first conductivity type of the substrate. A second insulator layer is formed on part of the second device feature region. A second gate electrode is formed on part of the surface of the second insulator layer, which covers a part of the source region of the IGFET of a second conductivity type, a part of the drain region of the IGFET of a second conductivity type and a part of the region of a first conductivity type in contact with the semiconductor substrate.

In said IGBT with a second gate assisting in the turn-off process of this invention, the current through the second source electrode and the first electrode is determined by the voltage across the second source electrode and the first electrode, the voltage across the first gate electrode and the first electrode and the voltage across the second gate electrode and the second source electrode.

According to still further another embodiment of the present invention, a method of forming a transmission gate is provided. The transmission gate constructed by two kinds of IGFET with opposite conductivity type comprises: (a) at least one IGFET of a first conductivity type with a heavily doped source region of a first conductivity type in the first device feature region, wherein the drift region of the IGFET of the first conductivity type is formed in a portion of the semiconductor substrate of a first conductivity type; (b) at least one IGFET of a second conductivity type with a heavily doped source region of a second conductivity type in the second device feature region, wherein the drift region of the IGFET of a second conductivity type is formed in a layer of a second conductivity type surrounding the trench from the side of the side walls and the bottom wall thereof at one side and in contact with the substrate of a first conductivity type at the other side.

The drain region of the IGFET of a first conductivity type is formed in a portion of the second device feature region. The source region of the IGFET of a first conductivity type is surrounded by a source-body region of a second conductivity type in the first device feature region except at the first main surface. Both source region and source-body region are connected to the first electrode on the first main surface. A first insulator layer is formed on a part of the first main surface of the first side. A first gate electrode is made on the top of the surface of said first insulator layer. The first gate electrode covers a part of the source region of said IGFET of a first conductivity type, a part of the source-body region and a part of the substrate of a first conductivity type.

The drain region of the IGFET of a second conductivity type is the source-body region of the IGFET of a first conductivity type. The source-body region of the IGFET of a second conductivity type is the drain region of the IGFET of a first conductivity type. The source region of the IGFET of a second conductivity type is surrounded by a source-body region except at the surface of the second device feature region and is connected to the source-body region through an electrode on the first main surface. A second insulator layer is formed on a part of the first main surface of the second side. A second gate electrode is made on the top of the surface of said second insulator layer. The second gate electrode covers a part of the source region of a second conductivity type, a part of source-body region and a part of drift region of the IGFET of a second conductivity type.

According to another embodiment of the present invention, the drift region can be used to realize discrete high-voltage/power devices or both high-voltage/power devices and low-voltage devices used in high-voltage/power integrated circuit. The low-voltage devices used in integrated circuit can be realized in a portion of the first main surface of the first side and/or in a portion of the first main surface of the second side.

One advantage of the present invention is to implement two device feature regions within one surface of a substrate, instead of implement any device feature region on the opposite surface (the bottom) of a substrate, which leads to a simple processing of devices and a low fabrication cost. Another advantage of the present invention is to implement an IGBT with a second gate assisting in the turn-off process, wherein the minority carrier injection ratio can be controlled and thus the tail of turn-off can be almost eliminated. Still another advantage of the present invention is an implementation of a power transmission gate with an n-MOS and a p-MOS by integration in one area instead of in two different areas. A further advantage of the present invention is to fabricate low voltage devices in power (or high-voltage) integrated circuit without additional dielectric isolation or junction isolation.

DETAILED DESCRIPTION OF THE INVENTION

Figure 1:
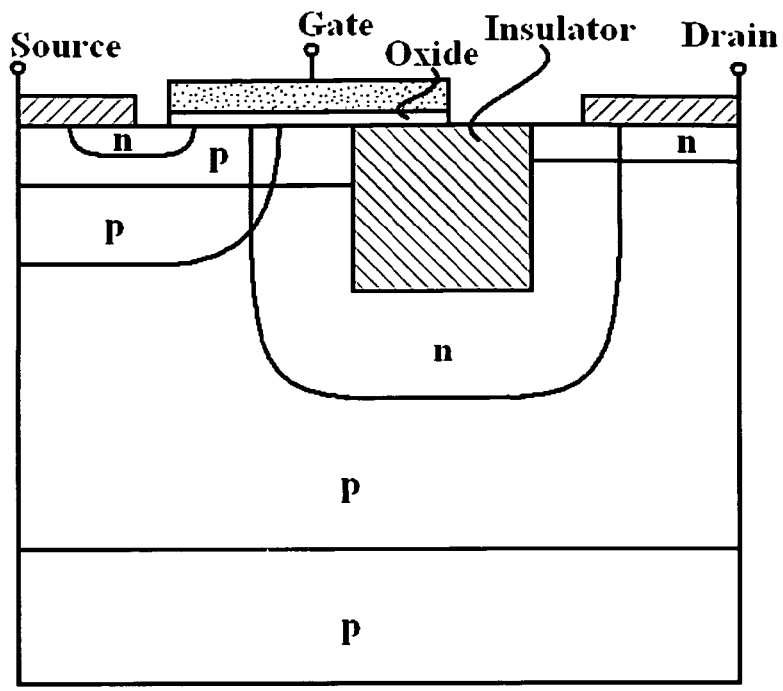
FIG. 1 shows the structures of U-shape drift regions in Kitamura et al., U.S. Pat. No. 5,844,275 (1998) (prior art).
Figure 2:
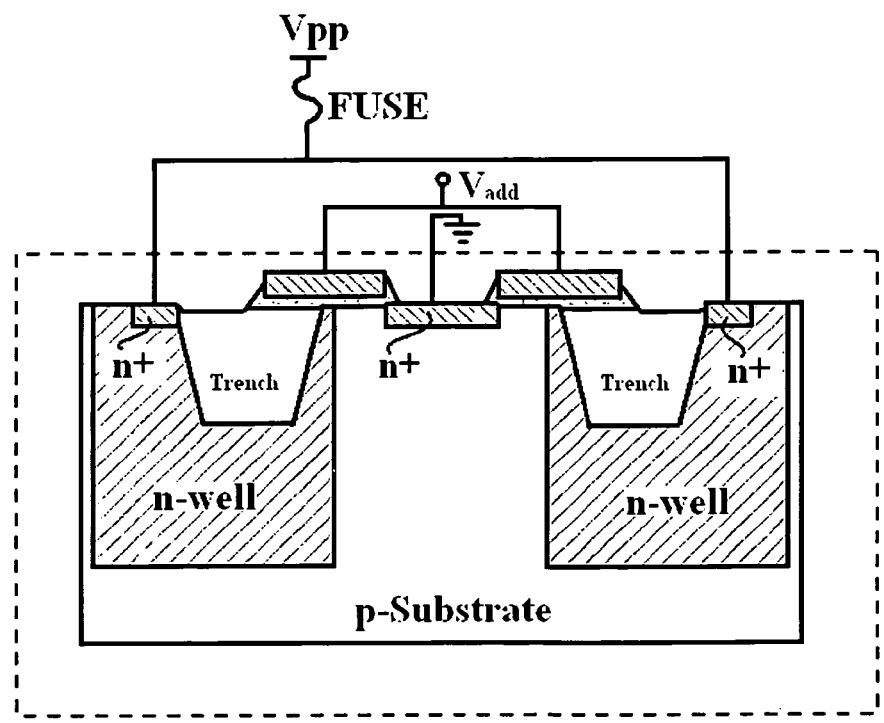
FIG. 2 shows the structures of U-shape drift regions in Kalnitsky et al., U.S. Pat. No. 6,525,397 B1 (2003) (prior art).
Figure 3:
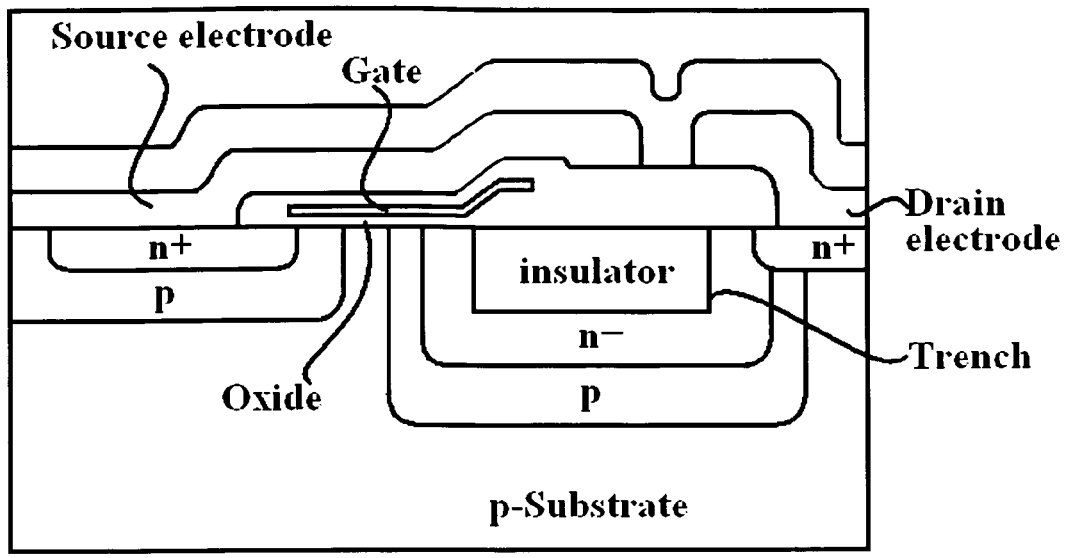
FIG. 3 shows the structures of U-shape drift regions in Kitamura et al., U.S. Pat. No. 6,998,680 B2 (2006) (prior art).
Figure 4:
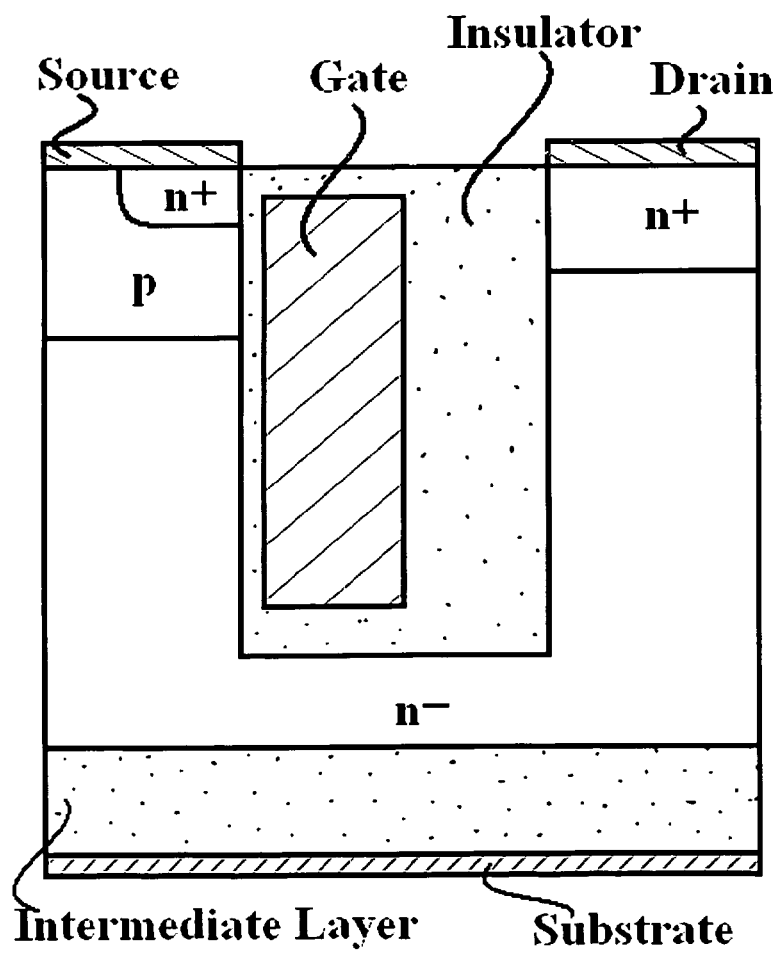
FIG. 4 shows the structures of U-shape drift regions in Baliga, B. J., U.S. Pat. No. 5,434,435 (1995) (prior art).
Figure 5:
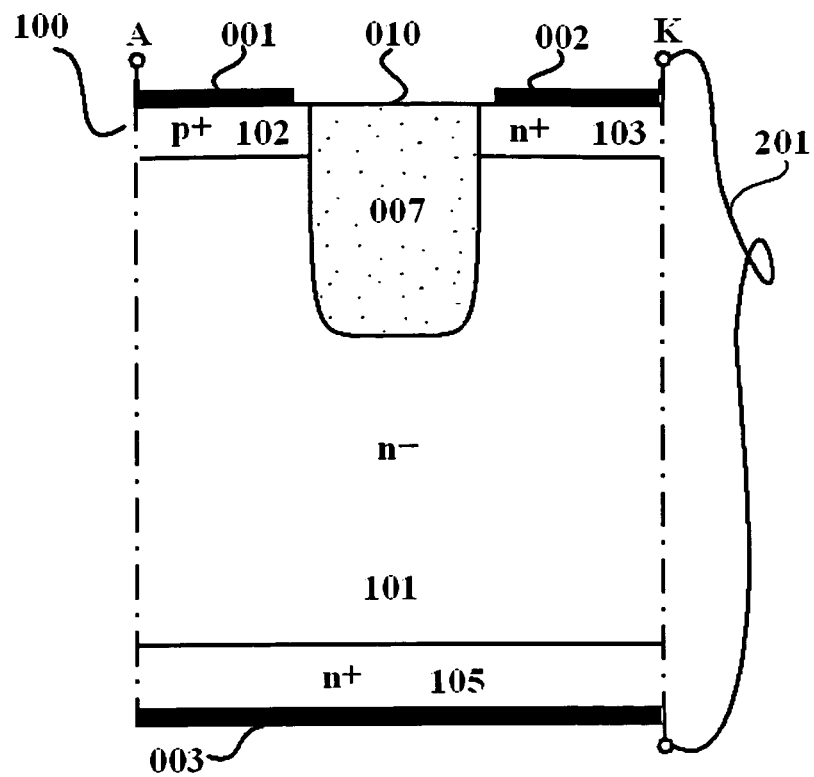
FIG. 5 shows a p-n junction diode with a trench and a U-shape drift region surrounding the trench for introduction of the present invention. The drift region is connected to the cathode K through $n^+$-region 105, electrode 003 and an external connection 201.

Due to that in most of devices, the sustaining of a reverse biased voltage can be explained based on a p-n junction, we start from an explanation of the drift region of this invention from a p-n junction diode under a reverse bias. FIG. 5 shows a cross-sectional view of a device structure 100 in the present invention. The dash-dotted lines represent the boundaries of a cell of the device. In this figure, the n-region, 101, is a U-shape drift region. A trench 010 is formed inside the U-shape region and filled with an insulator material 007 represented by dotted area in the figure. The portions at the top of the semiconductor of the two sides of the trench are the two device feature regions, where the first device feature region is on the first side and the second device feature region is on the second side. The bold line 001 at the left side of the U-region represents the conductor for forming the anode, A, which is connected to the $p^+$-region 102 (the second type of conductivity) belongs to the first device feature region. The bold line 002 at the right side of the U-region represents the conductor for forming the cathode K, which is connected to the $n^+$-region 103 (the first type of conductivity) belonging to the second device feature region.

With increasing of the reverse bias applied across the $n^+$-region 103 and the $p^+$-region 102 from zero, the depletion boundary extends from the interface between 102 and 101 towards the substrate. And, when the bias reaches such a value, that the boundary of the depletion region not only extends to the substrate but also to the right along the bottom wall of the trench. With continuously increasing of the reverse bias voltage, the boundary of the depletion region further extends to the right and to the right upper portion of the cell.

Suppose there is no outer connection such as 201 in the figure. In the case that the boundary of the depletion region is still located inside of the right boundary of the cell 100 even under the maximum allowable reverse bias voltage, then the electrode K has the same potential as that of the neutral region of the substrate. However, in a case that no neutral region exists between $n^+$-region 103 and the substrate under a certain reverse bias below the maximum allowable reverse bias voltage, then the voltage of the neutral region of $n^+$-region 105 cannot follow the voltage of $n^+$-region 103 immediately. This is because, when the voltage of 105 is different from the voltage of 103, an adjustment of the voltage of 105 needs an electron flow between them, but there is an electron barrier between them to obstruct such a flow.

In order to facilitate such an adjustment, an electrode 003 is set on the back of the substrate and an outer connection, 201, making the electrode 003 be connected to the electrode K.

Figure 6:
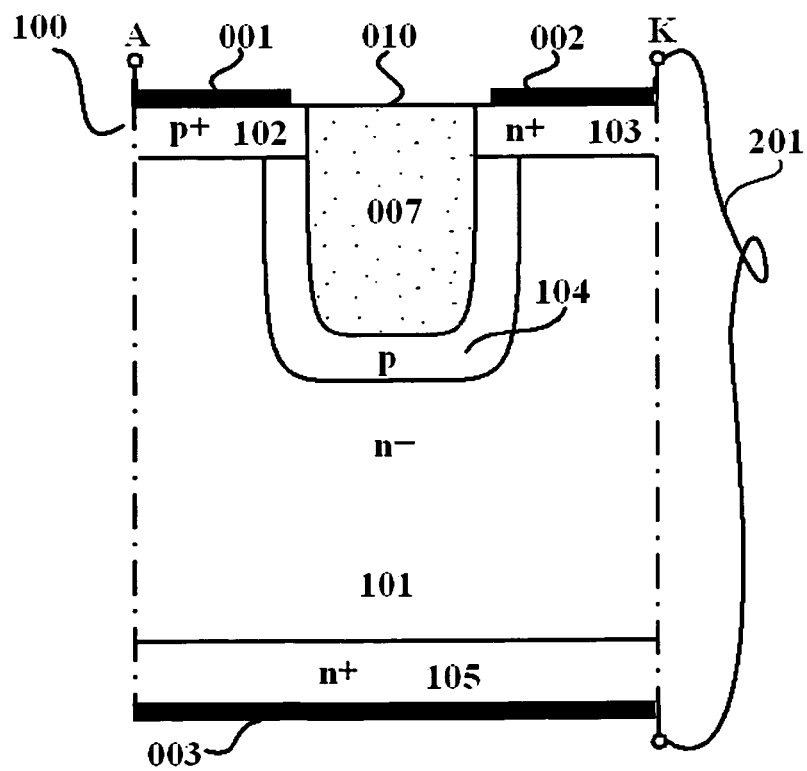
FIG. 6 shows another type of a p-n junction diode according to the present invention. As compared to the drift region in FIG. 5, the drift region includes an additional p-type layer 104 surrounding the trench from the side of sidewalls and the bottom wall thereof.

FIG. 6 shows a cross-sectional view of another structure of the drift region. A p-type layer 104 is formed in-between the trench and the n-region 101. The method of forming a p-type region surrounding the trench is a mature process used for implement of super-junction devices, where the p-type region 104 is used for charge compensation to reduce the on-resistance under the same breakdown voltage.

It should be pointed out that the shape of the trench is not restricted to a standard rectangle. Under a high reverse voltage, breakdown may occur at the corners of a standard rectangle. A standard rectangle is also not easily realized by fabrication processing. A higher breakdown voltage can be obtained if the bottom of the trench is smooth one without sharp angles. On the other hand, a V-shape trench is much easier to be implemented. And, the corner of the V-shape trench contributes little to the device breakdown. FIG. 7(a) and (b) show a diode realized by a V-shape trench. The structure in FIG. 7(b) has a p-type region 104, whereas the structure in FIG. 7(a) does not have.

Figure 7:
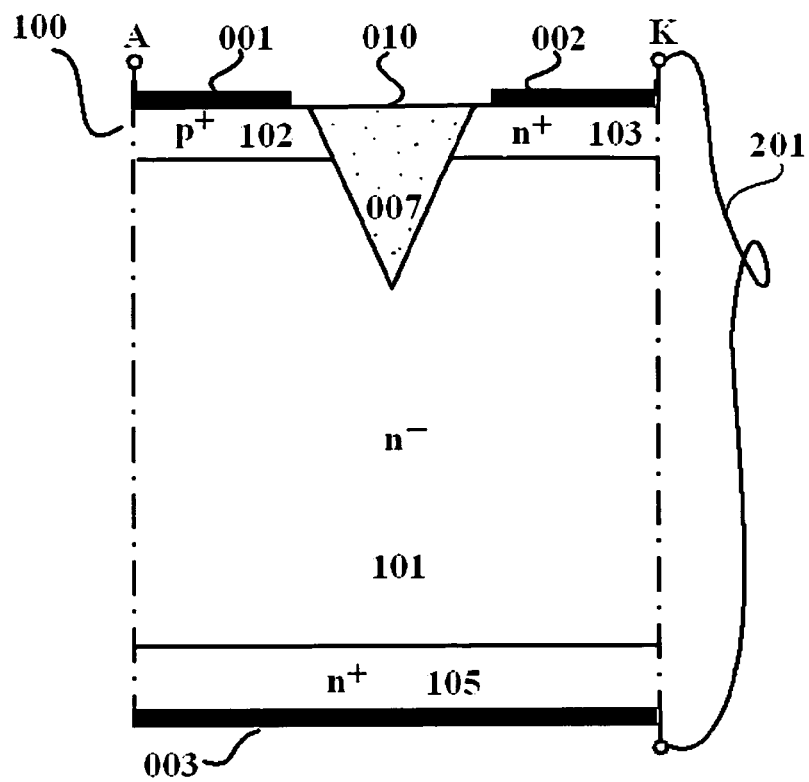
FIG. 7(a) shows a structure similar to that in FIG. 5 with a V-shape trench.
FIG. 7(b) shows a structure similar to that in FIG. 6 with a V-shape trench.
Figure 7:
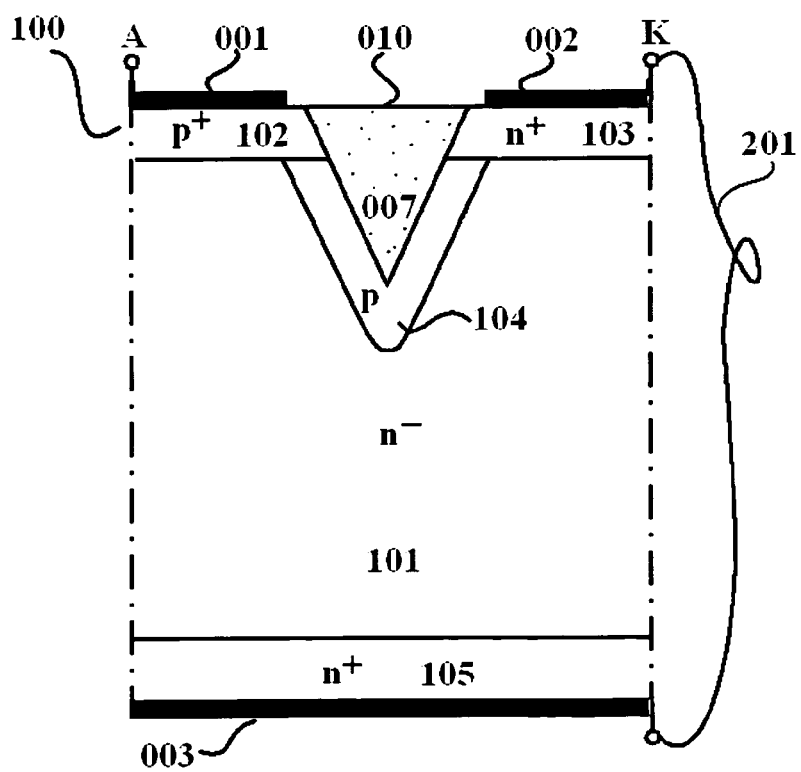

Based on the drift regions of this invention illustrated in FIGS. 5, 6 and 7, various high-voltage/power devices, discrete or integrated in power ICs, can be implemented based on such drift regions.

Under a reverse bias, the voltage is sustained by U-shape region. The voltages sustained by each side and by the bottom of U-shape region are determined by many parameters, such as the width of each side, the depth of the trench, the doping concentration of the substrate, the doping concentration of the p-type region surrounding the trench and the distribution of the impurities in the p-type region surrounding the trench. It should be noted here that the breakdown voltage of one side is reduced with the width increased, and can even approach zero. Such a situation may bring advantages to realize low-voltage integrated circuits.

Figure 8:
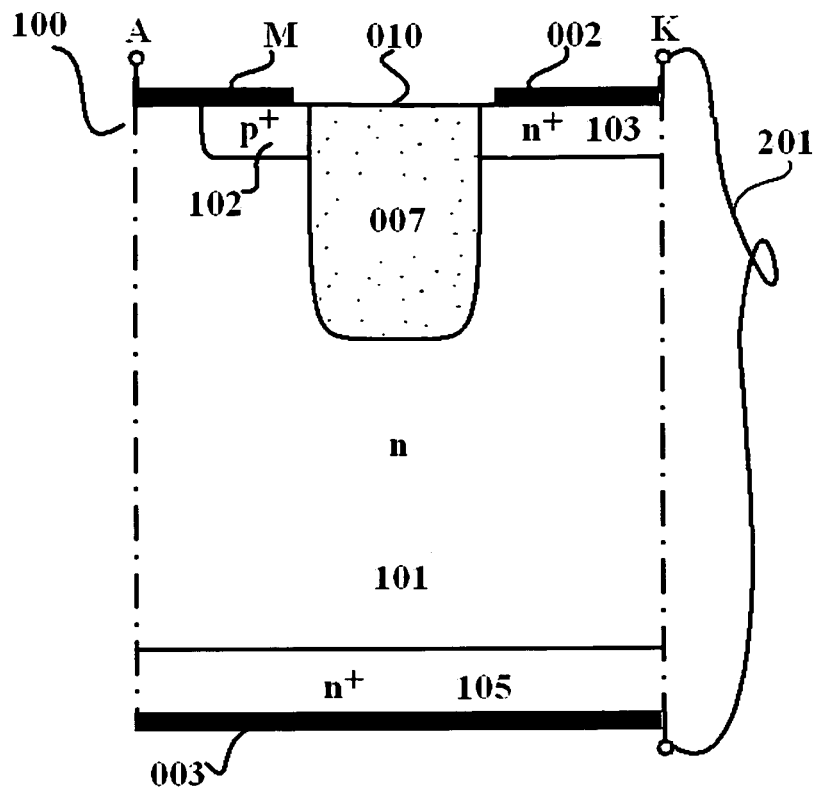
FIG. 8 schematically shows a Schottky diode based on the U-shape drift region according to the present invention.

FIG. 8 shows schematically a Schottky diode formed by this invention. A U-shape n-drift region 101 is formed in a portion of the substrate, where a trench 010 is located between the two sides of U-shape and filled with an insulator material 007, the dotted area in the figure. A metal M is used to form a metal-semiconductor contact with the n-region 101 and connected to the anode A of the Schottky diode. In the figure, the metal M is also connected to $p^+$-region 102 to avoid a too high field occurring at the edges of the contact of the metal M and n-region 101. The contact to $p^+$-region 102 is not necessary in the case that a too high field does not have. A heavily doped $n^+$-region 103 and a conductor 002 are used to form an ohmic contact for the cathode K. The Schottky diode includes the anode A, the cathode K and the U-shape region. In order to obtain a fast following of the potential of the neutral region of the substrate to that of 103, a heavily doped $n^+$-layer 105 is formed with an electrode 003, which is connected to the cathode K through an outer connection 201.

Figure 9:
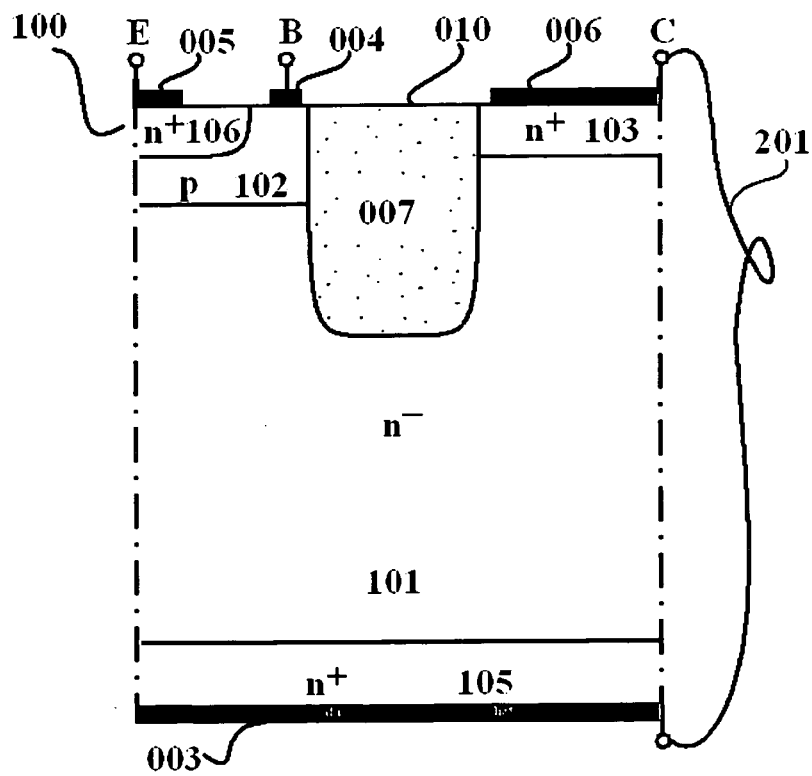
FIG. 9 schematically shows a bipolar transistor according to the present invention.

FIG. 9 shows schematically a bipolar transistor formed by this invention. As illustrated in the figure, the $n^+$-region 106 is contacted through a conductor 005 to the electrode E, forming the emitter of the transistor. The p-type region 102, forming the base of the transistor, is contacted through a conductor 004 to the base electrode B. Both the emitter and the base are located in the first device feature region. In the second device feature region, the collector electrode C is formed by the conductor 006 contacted to the $n^+$-region 103. The collector region is connected to the base region 102 through the $n^-$-drift region 101. In order to obtain a fast following of the potential of the neutral region of the substrate to that of 103, a heavily doped $n^+$-layer 105 is formed with an electrode 003, which is connected to the collector C and thus to the conductor 006 of the collector region 103 through an outer connection 201.

Figure 10:
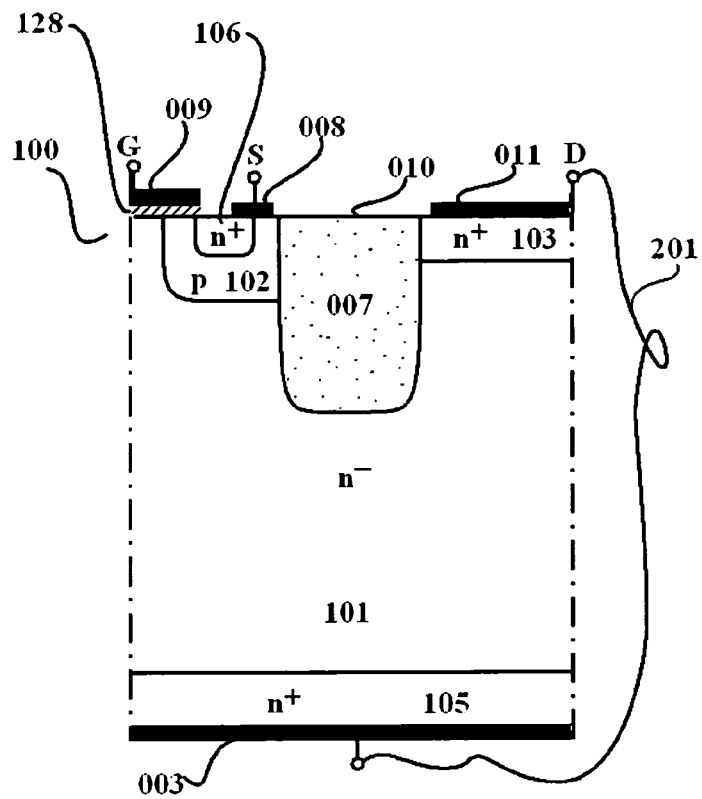
FIG. 10(a) schematically shows an n-MOS based on the drift region illustrated in FIG. 5.
FIG. 10(b) schematically shows an n-MOS based on the drift region illustrated in FIG. 6.
Figure 10:
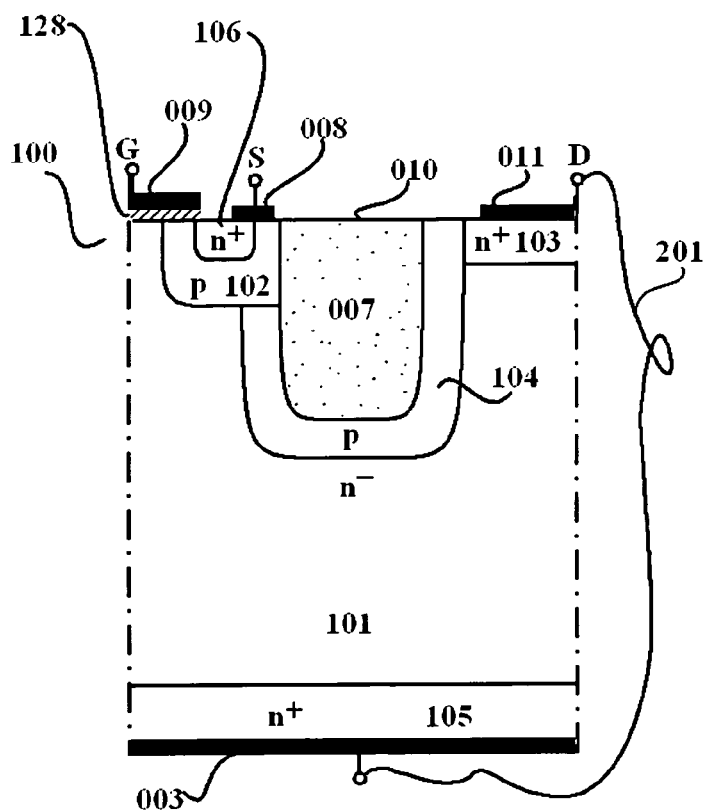

FIG. 10(a) shows schematically an n-MOS based on the drift region shown in FIG. 5 of this invention. In the first device feature region, the source electrode S contacts through a conductor 008 to the p-type source-body region 102 and the $n^+$-source region 106. An insulator layer 128, which is an oxide layer in the case of the IGFET being an n-MOS, covers a part of 106, a part of 102 and a part of 101. On the top of the insulator layer, a conductor 009 is formed for a gate electrode G. On the top of the second device feature region, a conductor 011 is formed on the $n^+$-region 103 for the drain electrode D.

FIG. 10(b) shows schematically an n-MOS based on the drift region shown in FIG. 6 of this invention.

As a MOS is an example of an IGFET, the structure of an IGFET can readily be used to a MOS.

Figure 11:
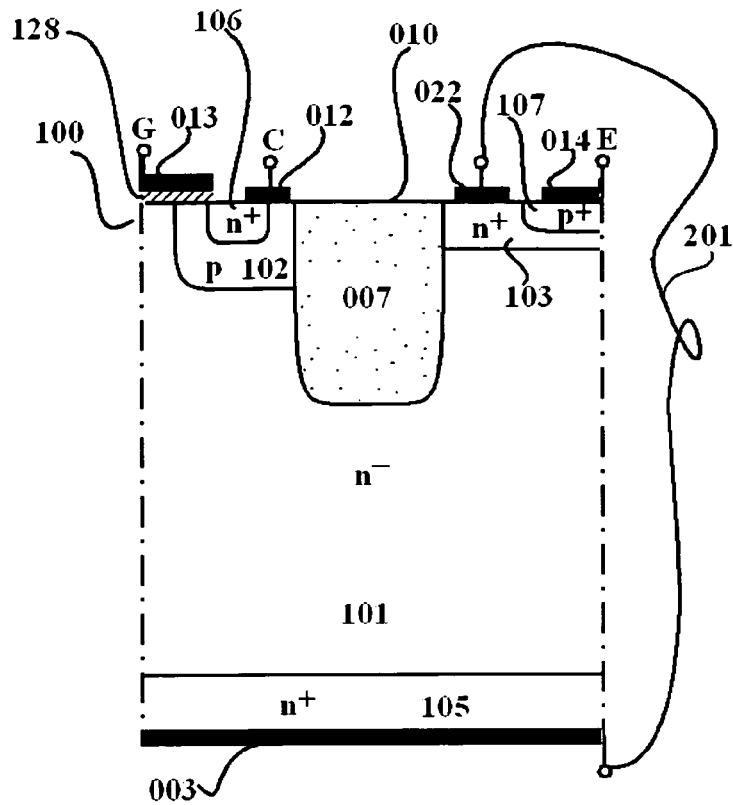
FIG. 11(a) schematically shows an IGBT based on the drift region illustrated in FIG. 5.
FIG. 11(b) schematically shows an IGBT based on the drift region illustrated in FIG. 6.
Figure 11:
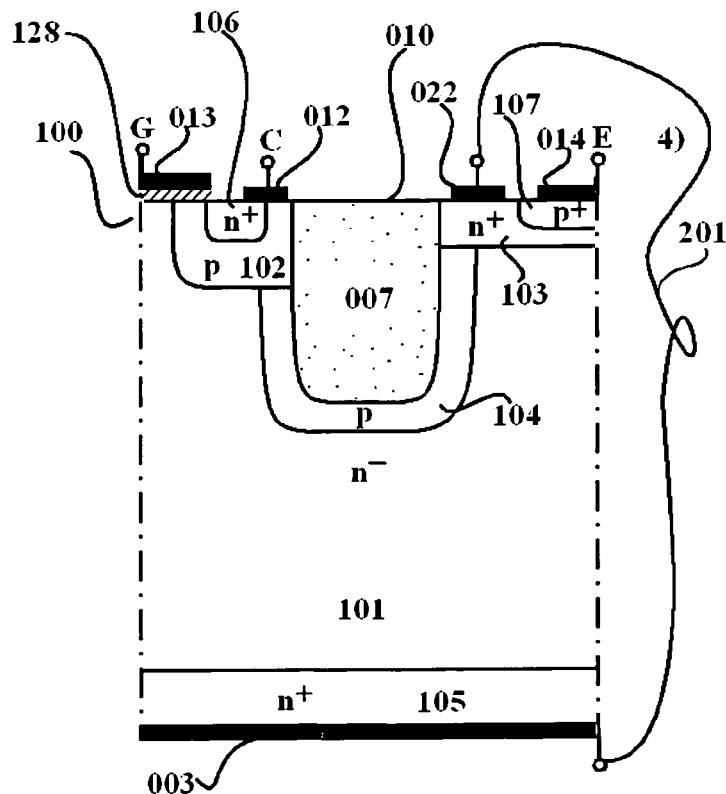

FIG. 11(a) shows schematically an IGBT based on the drift region shown in FIG. 5 of this invention. On the top of the first device feature region, a conductor 012 for the collector electrode C contacts directly to the p-type source-body region 102 and the n$^+$-source region 106. An insulator layer 128 covers a part of 102, a part of 106 and a part of 101. On the top of the insulator layer, a gate conductor 013 is used to form the gate electrode G. On the top of the second device feature region, there is a p$^+$-region 107 serving as an emitter region, which is in contact with a conductor 014 to form the emitter electrode E. In order to modify the injection efficiency, an n$^+$-buffer layer 103 is formed surrounding the emitter region except at its surface. Besides, a conductor 022 is made to contact with 103. An electrode 003 is formed on the bottom of the substrate and connected to 022 through an outer connection 201.

FIG. 11(b) shows schematically an IGBT based on the drift region shown in FIG. 6 in this invention.

Figure 12:
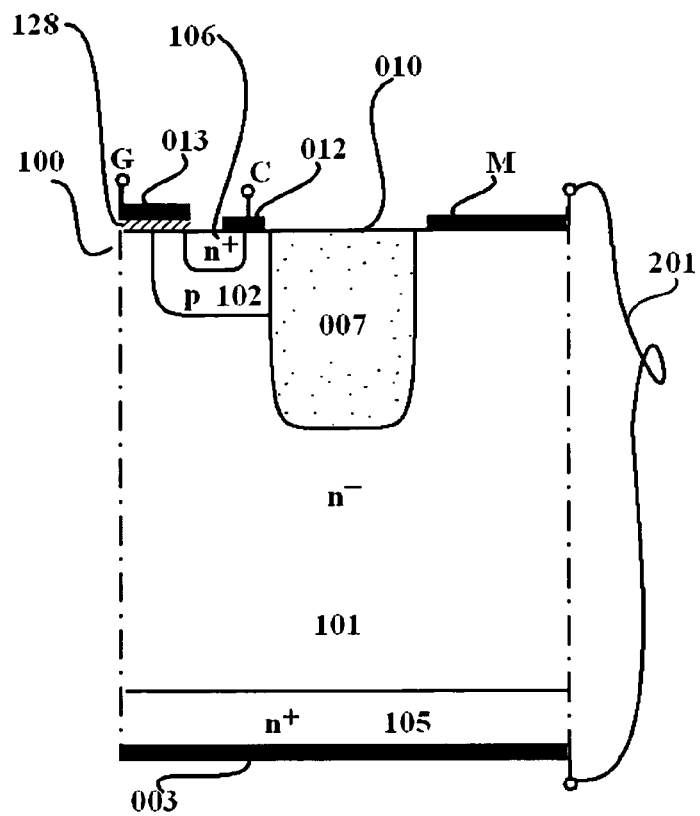
FIG. 12(a) schematically shows a SINFET based on the drift region illustrated in FIG. 5.
FIG. 12(b) shows a SINFET based on the drift region illustrated in FIG. 6.
Figure 12:
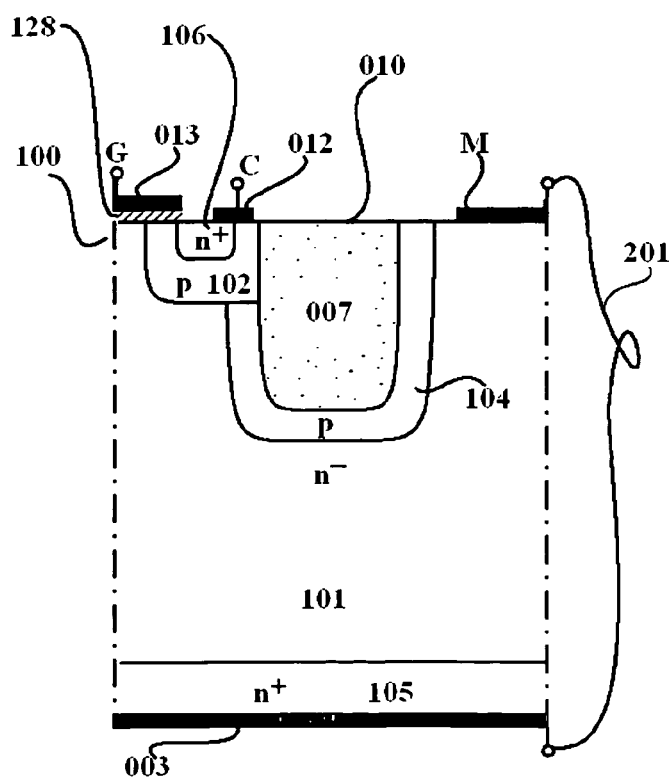

In order to reduce the injection of minorities and thus to obtain a short turn-off time, the emitter of the IGBT can be replaced by a metal. Such a device is called as a SINFET. FIG. 12(a) shows schematically a SINFET based on the drift region shown in FIG. 5 in the present invention. FIG. 12(b) shows schematically a SINFET based on the drift region shown in FIG. 6 in the present invention. The p$^+$-region 107 shown in FIGS. 11(a) and (b) is replaced by a metal M shown in FIGS. 12(a) and (b). Here, the buffer layer n$^+$-region 103 in FIG. 11 can be remained if it is needed according to the requirement.

Figure 13:
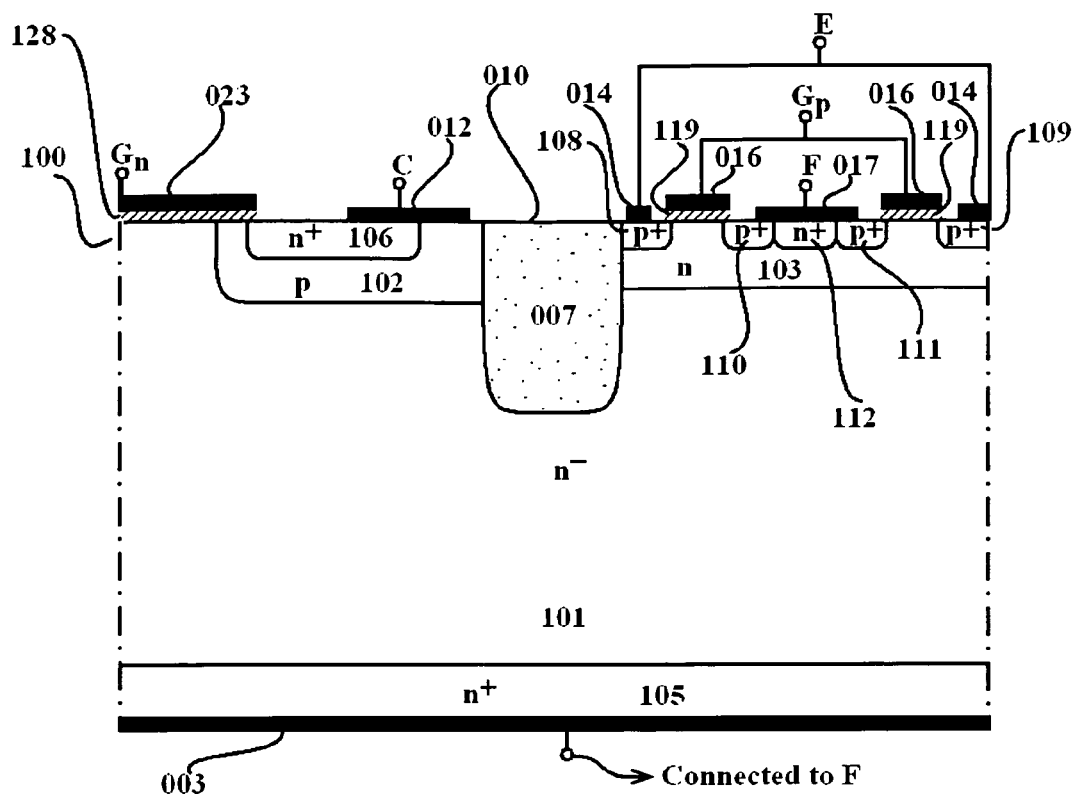
FIG. 13(a) shows an IGBT with an assisting gate in turn-off process based on the drift region illustrated in FIG. 5.
FIG. 13(b) shows an IGBT with an assisting gate in turn-off process based on the drift region illustrated in FIG. 6.
Figure 13:
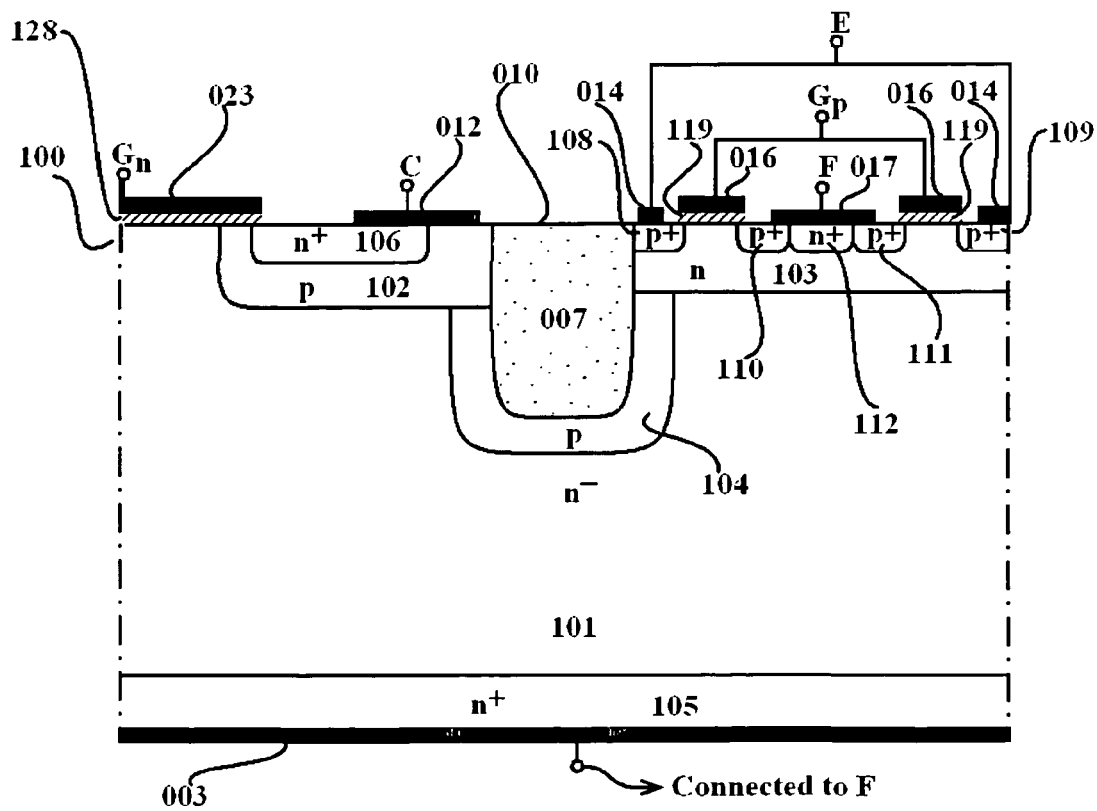

In addition to an IGBT with a modified injection efficiency shown in FIGS. 11(a) and (b), an IGBT with the structure shown in FIG. 13(a) of this invention has a controllable injection efficiency and even no minority carrier injection whenever it is necessary. The first device feature region is the same as that of an IGBT shown in FIG. 11(a), where the electrode of the gate 023 of the MOS is now labeled as G. In the second device feature region of FIG. 11(a), the electrons are absorbed and holes are injected in the on stage. Here in FIG. 13(a), in addition to that p$^+$-regions 108 and 109 are connected via the conductor 014 to the emitter electrode E directly, there are two other p$^+$-regions, namely 110 and 111, being connected to the n$^+$-region 112 via the conductor 017, which forms the electrode F. Thus, the p$^+$-regions 110 and 111 are connected to the drift region 101 through the n-type region 103. There are oxide layers on the top of the places between p$^+$-regions 119 and 110 and p$^+$-regions 109 and 111. The conductor 016 set on the top of the oxide layers is used to form the gate $G_p$ of a p-MOS. In the on-state of the IGBT, a conductive channel can be formed under a gate voltage lower than the threshold voltage making the p-MOS in conduction. Thus, a part of the electron current flows from n-region 103 and converted to be a hole current through the conductor 017. The magnitude of this hole current is controllable by the voltage applied to $G_p$. A certain amount of hole can still be injected into the drift region 101. In other words, the ratio between the hole current to the electron current in the drift region 101 can be controlled by the voltage applied to $G_p$. To turn the device off, the voltage applied to $G_n$ should be lower than the threshold voltage of the n-MOS and no electrons are injected into the drift region 101, while the voltage applied to $G_p$ should be lower than the threshold voltage of the p-MOS, making the p-MOS in the on-state with such a small voltage across source and drain, that the potential at the n-type region 103 is very close to the potential at p$^+$-regions 108 and 109, resulting in no injection of holes from p$^+$-regions 108 and 109 into the drift region 101. The conductor 003, which is formed on the n$^+$-region 105, is connected to electrode F through an outer connection.

FIG. 13(b) shows an IGBT with a second gate $G_p$ assisting in turn-off process, based on the drift region shown in FIG. 6 of this invention.

Figure 14:
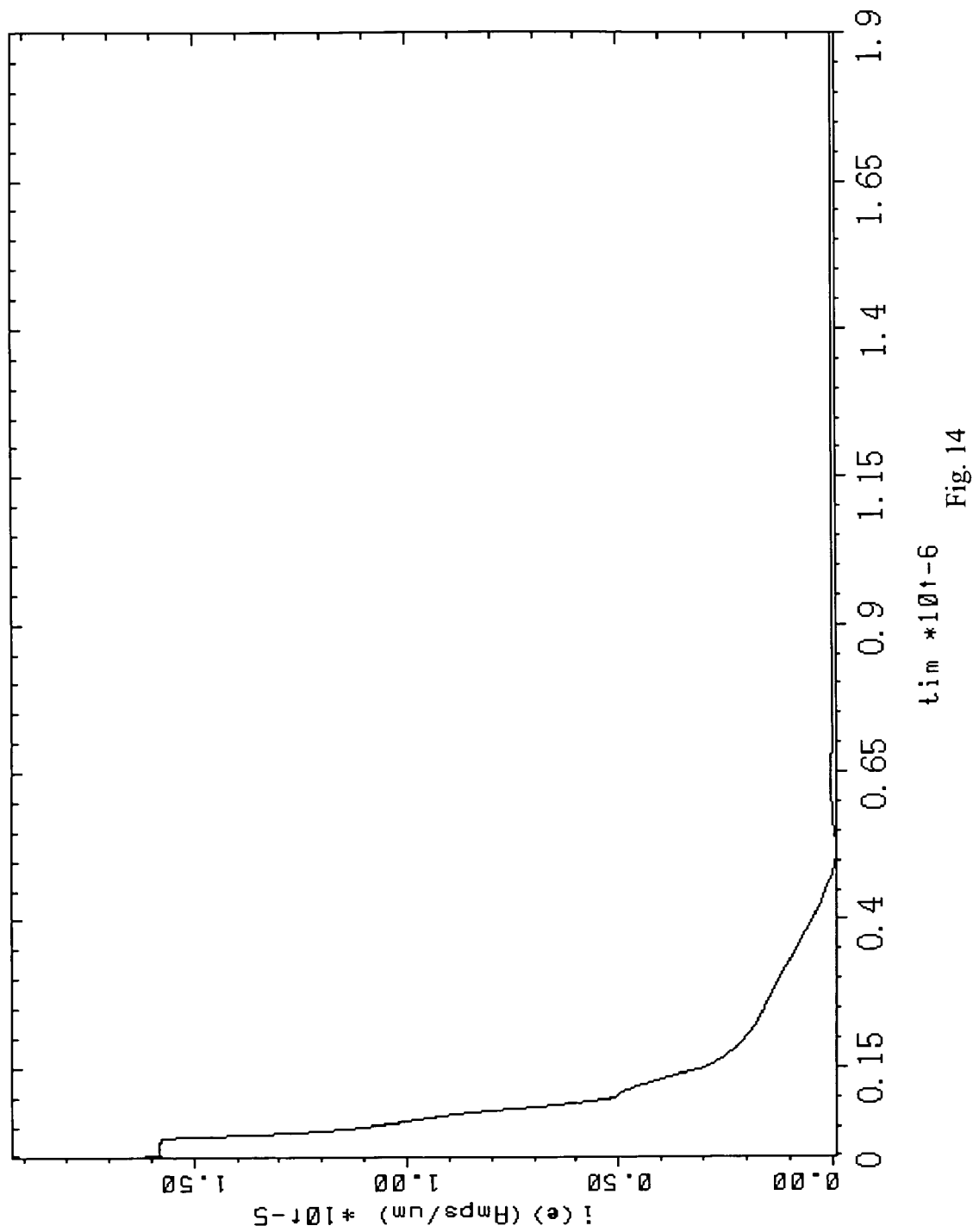
FIG. 14 shows the current versus time of the IGBT shown in FIG. 13(a) during the turn-off process.

It is well-known that the long tail of the turn-off process of an IGBT is owing to the fact that holes are still injected into the drift region caused by an electron flow from drift region to the emitter region during turning-off. Such an injection of holes can be entirely eliminated based on the structure shown in FIGS. 13(a) and 13(b). FIG. 14 shows the current versus time in the turn-off process. This figure is a simulation result based on the structure of a cell of interdigitated layout shown in FIG. 13(a). The simulation parameters are set as below: a width of 12.5 μm for each side of the drift region, a trench width of 5 μm, a depth of 30 μm for the trench, a relative permittivity of 1 for the filled insulator material, a 230 μm thick silicon substrate with a doping concentration of $1\times10^{13}$ cm$^{-3}$ and a lifetime of 10 μs for minorities. The emitter E is connected to the anode of a voltage source through a resistor of $1.2\times10^7$ ohm·μm, while the cathode of the voltage source is connected to the collector. The voltage source is 190V. Before turning-off (time t≦0), the voltage of the gate $G_n$, to the collector C is +15V and the voltage of the gate $G_p$ to the emitter E is 0V. The current density is then $1.6\times10^{-5}$ A/μm. Starting from t=0, the voltage of the gate $G_n$, to the collector C decreases from +15V to 0V within 0.1 μs and the voltage of $G_p$ to the emitter E changes from 0V to −15V within 0.1 μs. As can be seen in the figure, the total turn-off process takes only 0.4 μs. It should be pointed out that the parameters used in the simulation are not optimized. The simulation is merely used to demonstrate that the turn-off time of IGBT can be much reduced with such a structure.

Figure 15:
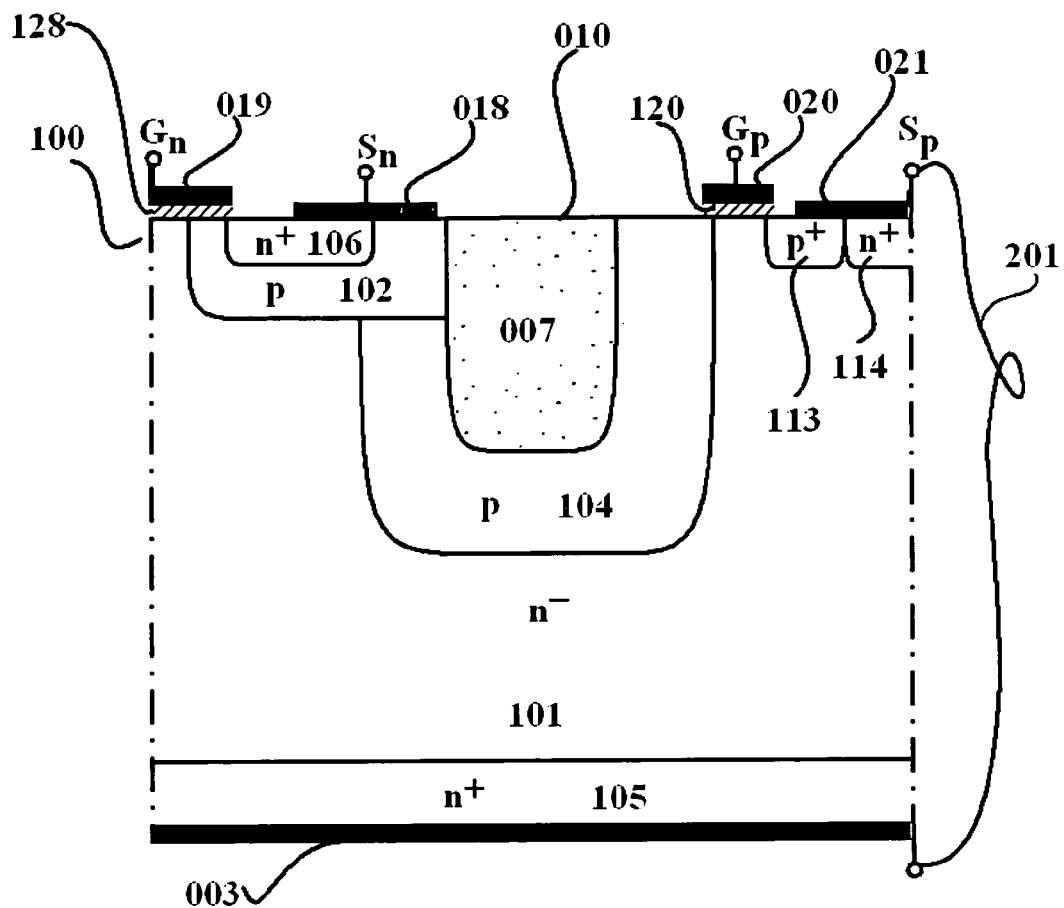
FIG. 15 illustrates a high-voltage/power transmission gate based on the drift region illustrated in FIG. 6.

Based on the drift region presented in FIG. 6, a power transmission gate including a p-MOS in parallel with an n-MOS can be realized. FIG. 15 schematically shows a cell of such a structure, where $S_n$ and 018 stand for the source electrode and its contact conductor of the n-MOS, which are also the drain electrode and its contact conductor of the p-MOS, respectively. $S_p$ and 021 stand for the source electrode and its contact conductor of the p-MOS, which are also the drain electrode and its contact conductor of the n-MOS, respectively. $G_n$, and 019, $G_p$ and 020 are the gate electrodes and conductors of the n-MOS and p-MOS, respectively. The shaded areas, 128 and 120, are gate oxides of the n-MOS and p-MOS, respectively. The electrode 003 connected to n$^+$-region 105 can be connected to the electrode $S_p$ through an outer connection 201. The n-MOS is composed of the source electrode $S_n$, the source region 106, the source-body region 102, the gate electrode $G_n$ and conductor 019, the gate oxide 128, the n-type drift region 101, the drain region 114 and finally the drain electrode $S_p$. The p-MOS is composed of the source electrode $S_p$, the source region 113, the source-body region of the p-MOS 101, the gate electrode $G_p$, the gate oxide 120, the p-type drift region 104, the drain region 102 and finally the drain conductor 018 and the drain electrode $S_N$.

Figure 16:
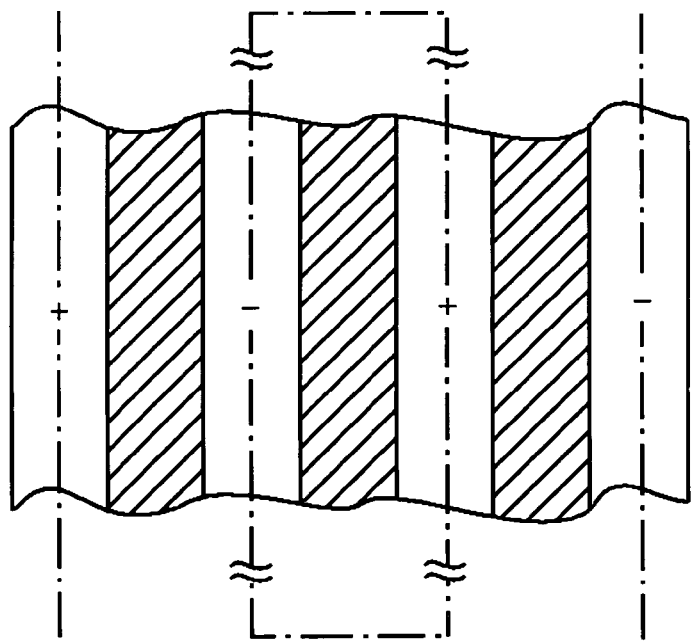
FIG. 16(a) is a top view of the layout of the interdigitated cells.
FIG. 16(b) is a top view of the layout of the rhombic cells.
FIG. 16(c) is a top view of the layout of the hexagonal cells.
Figure 16:
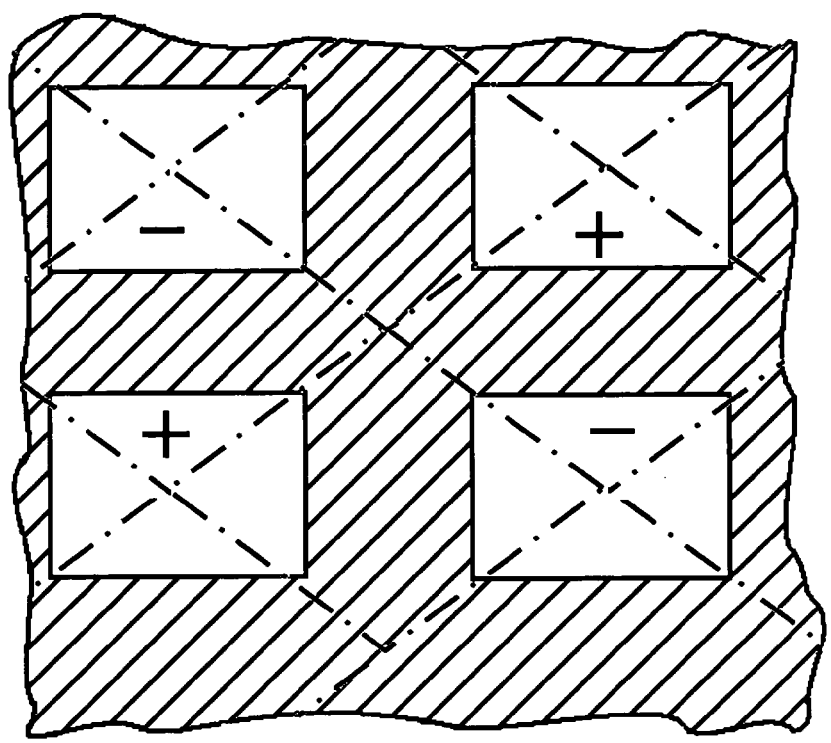
Figure 16:
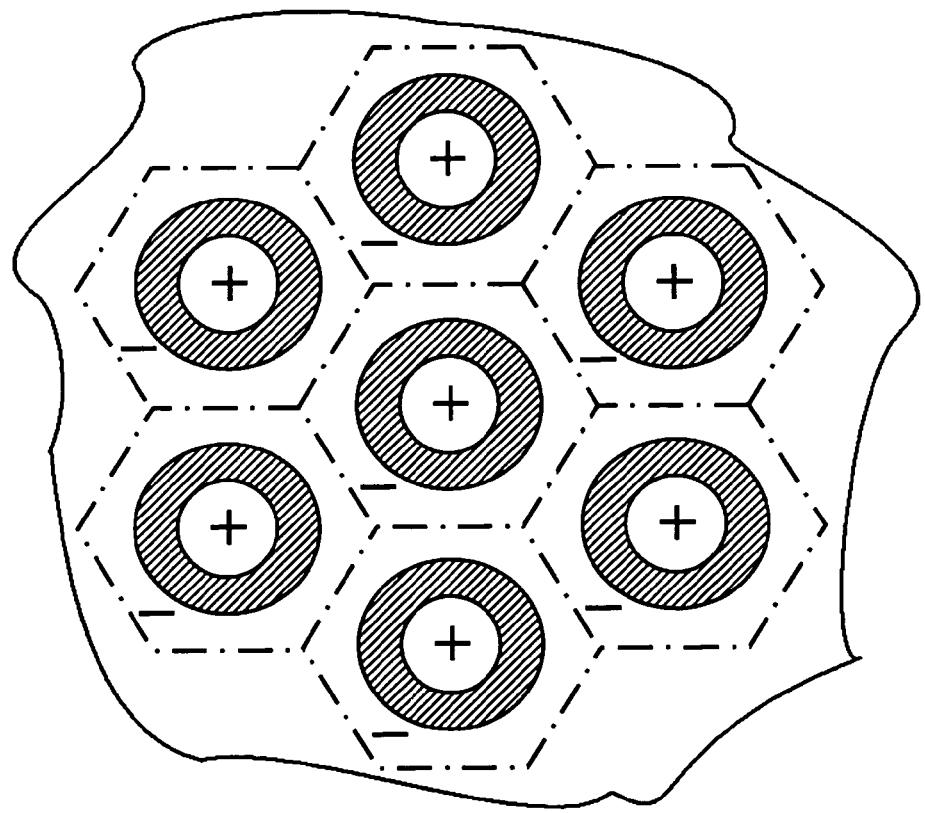

In the above applications, a single cell is used to explain the device. In fact, a real device can be formed by a parallel connection of many cells. FIG. 16(a), FIG. 16(b) and FIG. 16(c) schematically show the top views of three types of close-packed cells. The shaded areas represent the locations of a trench. The areas at one side of the trench represent the left regions shown in the various cross-sectional views, and the areas at the other side of the trench represent the right region shown in the same cross-sectional views. A mark "+"

is placed to represent the tops of the sides of each cell where they have the same potential. A mark "–" is placed to represent the tops of the other sides of each cell where they have the same potential, but different from the former. FIG. 16(a) shows a top view of interdigitated cells. FIG. 16(b) shows a top view of rhombic shape cells. FIG. 16(c) shows a top view of hexagonal cells.

It should be pointed out that the size of a cell is determined by the requirement of application. They can either be the same or not. For example, a certain interdigitated cell shown in FIG. 16(a) may be wider than the others. For another example, seven hexagonal cells shown in FIG. 16(c) may be replaced by one big hexagonal cell.

Figure 17:
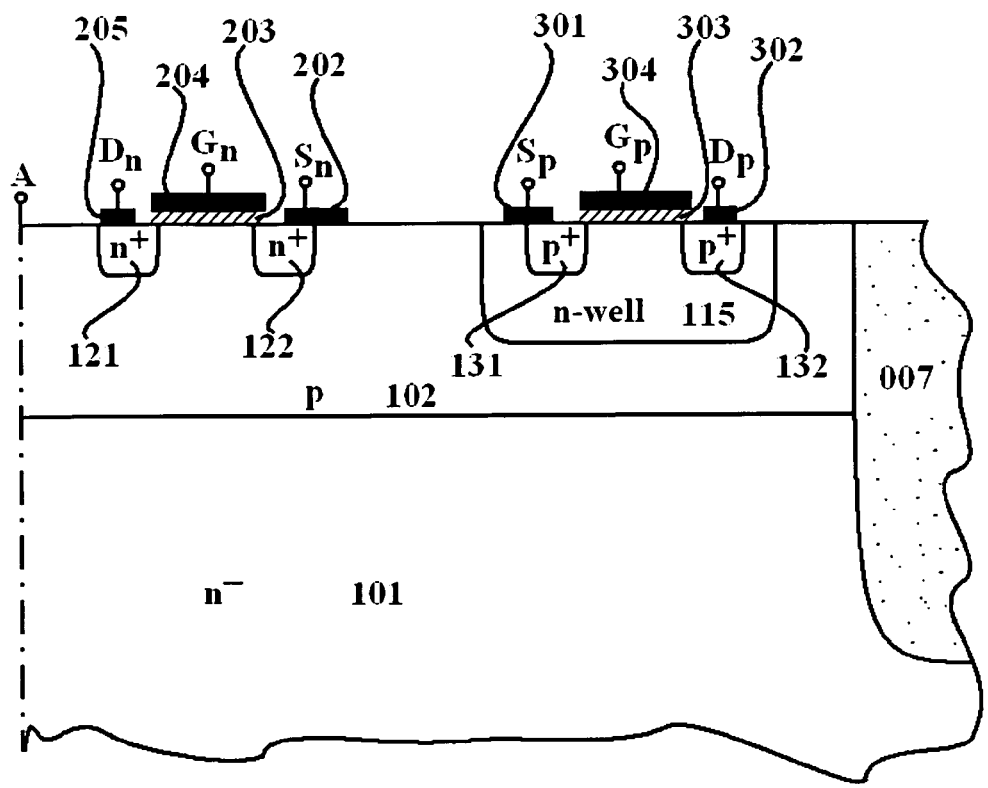
FIG. 17(a) schematically shows a low-voltage n-MOS and a low-voltage p-MOS formed in the left upper portion of the structure shown in FIG. 5, where an n-well 115 is formed for implementation of the p-MOS.
FIG. 17(b) schematically shows a low-voltage n-MOS and a low-voltage p-MOS formed in the left upper portion of the structure shown in FIG. 5, where a p-well 116 is formed inside the n-well 115 for implementation of the n-MOS.
Figure 17:
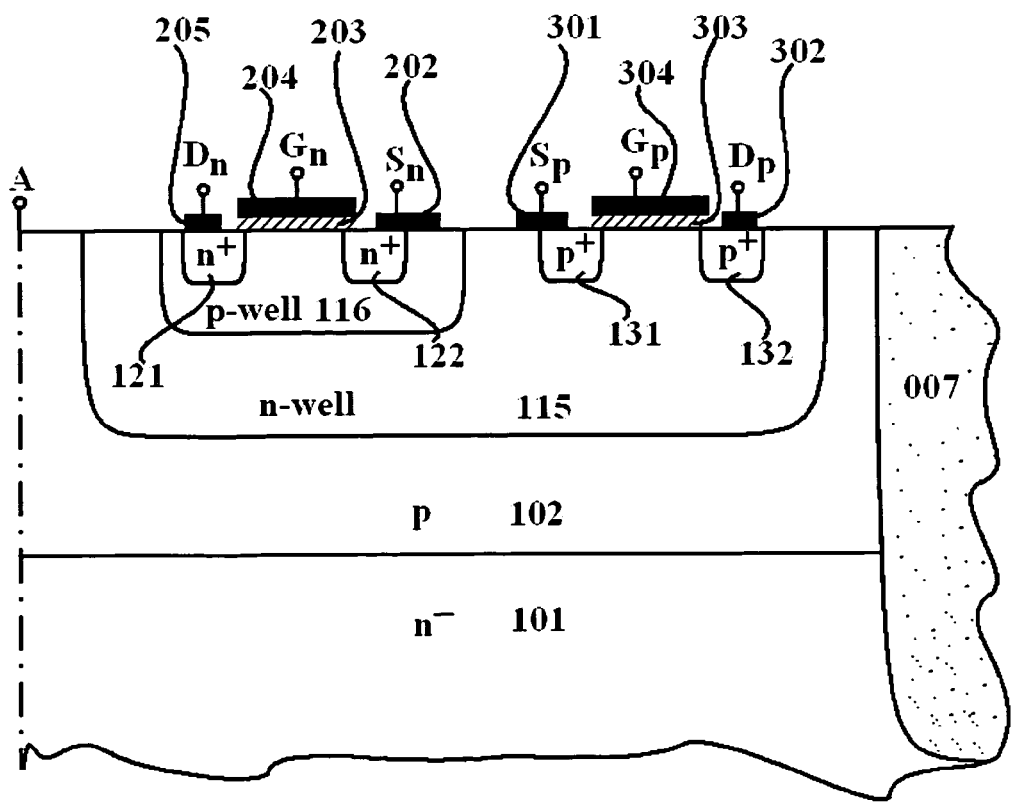

In addition to the power (high-voltage) devices, low-voltage devices can also be realized based on the structure proposed by this invention. FIG. 17(a) shows a low-voltage p-MOS and a low-voltage n-MOS formed on the top of the left side of the structure shown in FIG. 5, where the potentials of the sources and drains of the n-MOS and the p-MOS have not too much differences with that of the top of the left side of FIG. 5. The n-MOS has p-type region 102 as its source-body. The source region 122 is connected to the source-body region 102 through the conductor 202 of the electrode $S_n$, the drain electrode $D_n$, is formed on the surface of the drain region 121 through the conductor 205. The conductor 204 for the gate electrode $G_n$ is formed on an insulator layer 203, which is located on the surface between the $n^+$-regions 121 and 122. The p-MOS is formed in an n-well 115. The $p^+$-source region 131 is connected to the source-body region through the conductor 301 for the source electrode $S_p$. The conductor 302 for the drain electrode $D_p$ is formed on the surface of the drain region 132. The conductor 304 for the gate electrode $G_p$ is formed on an insulator layer 303, which is located on the surface between the $p^+$-regions 131 and 132.

In the case that the potential of the source and source-body region of the n-MOS should not be the same as that of the electrode A shown in FIG. 17(a), a p-well 116 can be formed in the n-well 115. FIG. 17(b) shows such a structure.

Figure 18:
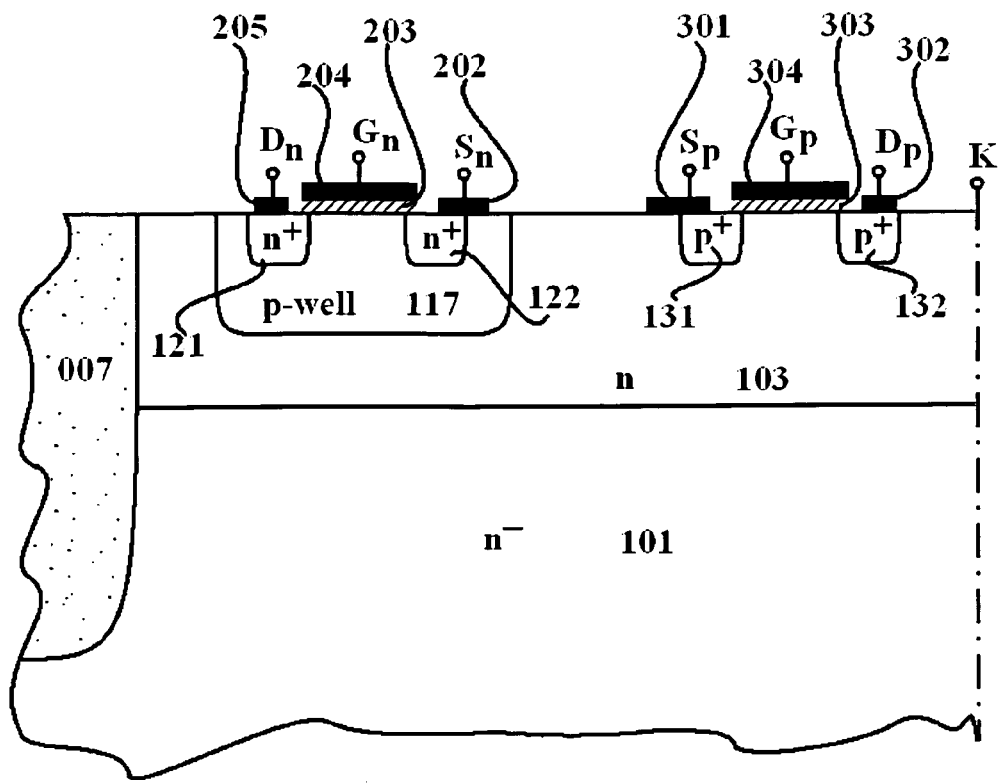
FIG. 18(a) schematically shows a low-voltage n-MOS and a low-voltage p-MOS formed in the right upper portion of the structure shown in FIG. 5, where a p-well 117 is formed for implementation of the n-MOS.
FIG. 18(b) schematically shows a low-voltage n-MOS and a low-voltage p-MOS formed in the right upper portion of the structure shown in FIG. 5, where an n-well 118 is formed inside the p-well 117 for implementation of the p-MOS.
Figure 18:
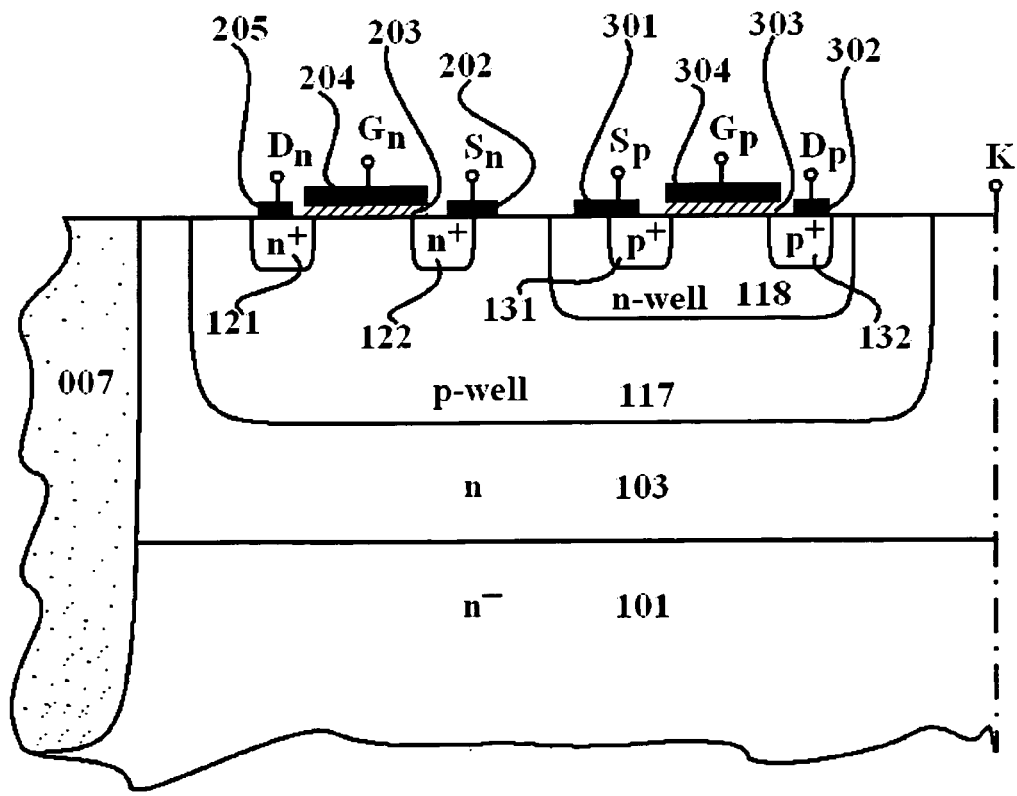

FIG. 18(a) shows a low-voltage p-MOS and a low-voltage n-MOS formed on the top of the right side of the structure shown in FIG. 5, where the potentials of the sources and drains of the n-MOS and the p-MOS have not too much differences with that of the top of the right side of FIG. 5. The n-MOS is formed in a p-well 117.

In the case that the potential of the source and source-body region of the n-MOS should not be the same as that of the electrode K, an n-well 118 can be formed in the p-well 117. FIG. 18(b) shows such a structure.

Obviously, in addition to MOS's, other low-voltage devices can also be realized according to the present invention.

The low-voltage devices described so far are formed in one cell. Evidently, they can also be formed in several cells. Moreover, they can be placed in only a part of one side of a cell, whereas the remaining part(s) can still be used for the high-voltage device. In addition, the low-voltage devices can be arranged not only in the horizontal direction as shown schematically in FIG. 17 and FIG. 18, they can be arranged but also in the direction perpendicular to the paper, or even in both directions.

Apparently, all of the n-type regions and all of the p-type regions can be exchanged one to another, the device then changes to a device of a conductivity type opposite to the original one.

In above examples, no case that both device feature regions are metals contacted directly to the drift region has been described. However, It should be pointed out here, that such a situation is allowable. For example, a resistor can be formed with such a structure, where the value of the resistor is determined by the geometry and physical parameters of the drift region.

Besides, the trench can be filled with air. Also, a thin $SiO_2$ layer can be grown in the inner surface of the trench and insulator can then be filled.

It must be pointed out that there are a lot of parameters can be chosen, such as: the width of each side of the trench, the doping concentrations of each semiconductor region. Therefore, a reasonable field profile and thereby a highest breakdown voltage can be achieved under a practical available condition of technology.

The techniques proposed by this invention have been illustrated by many examples of applications. It should be understood that various changes and modifications to the presently preferred embodiments described herein will be apparent to those skilled in the art. Such changes and modifications may be made without departing from the spirit and scope of the present invention and without diminishing its attendant advantages. It is therefore, intended that such changes and modifications be covered by the appended claims.

What is claimed is:

1. A semiconductor device having a U-shape drift region comprising a semiconductor substrate; said substrate having at least one trench filled with an insulator formed in a first main surface of said substrate; wherein said substrate is a first conductivity type or a combination of a first conductivity type and a second conductivity type;

wherein in said combination of a region of a first conductivity type and a region of a second conductivity type, said second conductivity type region surrounds said trench and is surrounded by said region of said first conductivity type;

said trench with its surrounding semiconductor forms a cell, and said semiconductor device consists of at least one cell;

two device feature regions of said device are formed on said substrate at each side of said trench beneath said first main surface, where the first device feature region is at the first side and the second feature region is at the second side;

said U-shape drift region is started from said first device feature region, through said semiconductor substrate and terminated at said second device feature region;

wherein said first device feature region is an insulated gate field effect transistor (IGFET) of a first conductivity type for injecting carriers of first conductivity type into said drift region of U-shape in the on-state, said IGFET of a first conductivity type having at least a first source region of a first conductivity type in said first device feature region, said first source region surrounded by a first source-body region of a second conductivity type except at said first main surface; wherein a part of said first source region and a part of said first source-body region are contacted with a first electrode at said first main surface; wherein said first electrode is the first source electrode of said IGFET of a first conductivity type; wherein a first insulator layer is formed on part of said first main surface of said first side; and a first gate electrode is formed on the top of said first insulator layer; said first gate electrode covering a part of said first source region of said IGFET of a first conductivity type, a part of said first source-body region and a part of said substrate;

wherein said second device feature region comprises a passive device region or an active device region;

wherein said passive device region of said second device feature region comprises a p-n junction for injecting carriers of second conductivity type into said drift region of U-shape in the on-state; said junction is formed by a region of semiconductor of a second conductivity type surrounded by a region of semiconductor of a first conductivity type except at said first main surface; wherein a part of said region of semiconductor of second conductivity type of said second device feature region is in contact with a second electrode; and whereby the current from said second electrode to said first electrode is determined by the voltage between said second electrode and said first electrode, and the voltage between said first gate electrode and said first electrode altogether;

wherein said active device region of said second device feature region comprises at least one IGFET of a second conductivity type with a second source region of a second conductivity type located in said second device feature region and in contact with said second electrode and wherein said second electrode is a second electrode of said IGFET of a second conductivity type; wherein in said IGFET of a second conductivity type, a second drain region is formed by a region of a second conductivity type in said second device feature region, and a region of a first conductivity type is located adjacent to said second drain region and is connected to said second drain region through an electrode at the first main surface, whereby said second drain region is connected to said substrate; an insulator layer is formed on part of said first main surface of said second device feature region; a second gate electrode covers at least a part of said second source region of said IGFET of a second conductivity type, a part of said second drain region of said IGFET of a second conductivity type and an area between said second source region and said second drain region, said area is a region of a first conductivity type in contact with said substrate; and whereby the current from said second electrode to said first electrode is determined by the voltage between said second electrode and said first electrode, and the voltage between said first gate electrode and said first electrode as well as the voltage between said second gate electrode and said second source electrode altogether;

wherein said first device feature region also serves as a region for collecting carriers of said second conductivity type from said drift region of U-shape; and wherein said second device feature region also serves as a region for collecting carriers of said first conductivity type from said drift region of U-shape;

wherein a surface opposite to said first main surface of said substrate is defined as a second main surface, and wherein a third electrode is in contact through an ohmic contact or a heavily doped layer of a first conductivity type with said second main surface; and wherein said third electrode is connected through an outer connection to a part of said region of semiconductor of first conductivity type in said second device feature region; and wherein said drift region serves as a voltage-sustaining region.

* * * * *